United States Patent [19]
Furlan et al.

[11] Patent Number: 5,550,540
[45] Date of Patent: Aug. 27, 1996

[54] DISTRIBUTED CODING AND PREDICTION BY USE OF CONTEXTS

[75] Inventors: Gilbert Furlan, Roquebrune-Cap-Martin, France; Jorma J. Rissanen, Los Gatos, Calif.; Dafna Sheinvald, Nofit, Israel

[73] Assignee: Internatioal Business Machines Corporation, Armonk, N.Y.

[21] Appl. No.: 975,300

[22] Filed: Nov. 12, 1992

[51] Int. Cl.$^6$ ..................................................... H03M 7/30
[52] U.S. Cl. ............................................. 341/51; 341/79
[58] Field of Search ................................. 341/51, 67, 79, 341/107

[56] References Cited

U.S. PATENT DOCUMENTS

| | | | |
|---|---|---|---|
| 4,099,257 | 7/1978 | Arnold et al. | 341/67 |
| 4,464,650 | 8/1984 | Eastman et al. | 341/51 |
| 5,023,611 | 6/1991 | Chamzas et al. | 341/51 |
| 5,097,261 | 3/1992 | Langdon, Jr. et al. | 341/51 |
| 5,109,226 | 4/1992 | MacLean, Jr. et al. | 341/95 |
| 5,179,378 | 1/1993 | Ranganathan et al. | 341/51 |
| 5,210,536 | 5/1993 | Furlan | 341/107 |
| 5,379,036 | 1/1995 | Storer | 341/51 |

OTHER PUBLICATIONS

Shannon, "A Mathematical Theory of Communication", The Bell System Technical Journal, vol. XXVII Jul., 1948, No. 3.

Rissanen et al., "Universal Modeling and Coding", IEEE Transactions on Information Theory, vol. IT-27, No. 1 Jan. 1981.

Tunstall, "Synthesis of Noiseless Compression Codes", Georgia Institute of Technology, Sep., 1967.

Ziv et al., "A Universal Algorithm for Sequential Data Compression", IEEE Transactions on Information Theory, vol. IT-23, No. 3 May 1977.

Ziv et al., "Compression of Individual Sequences via Variable-Rate Coding", IEEE Transactions on Information Theory, vol. IT-24, No. 5, Sep. 1978.

Rissanen, "A Universal Data Compression System", IEEE Transactions on Information Theory, vol. IT-29, No. 5, Sep. 1983.

Rissanen, "Complexity of Strings in the Class of Markov Sources", IEEE Transactions on Information Theory, vol. IT-32, No. 4, Jul. 1986.

*Primary Examiner*—Marc S. Hoff
*Attorney, Agent, or Firm*—James C. Pintner; Lucas S. Chang

[57] ABSTRACT

The present invention comprises a distributed data processing system including a plurality of data processing elements for expeditiously performing an encoding or prediction function pursuant to a context-based model in an adaptive, optimal and time-progressive manner. The distributed data processing system, having access to each symbol of an input data string at each clock cycle, adaptively generates context-relevant data sets which provide the best model for coding or prediction based on the input symbols. Each symbol and its best model for encoding or prediction emerge concurrently from the system, resulting in a favorable time complexity of O(n) for an n-symbol input data string.

14 Claims, 5 Drawing Sheets

DISTRIBUTED CODING AND PREDICTION BY USE OF CONTEXTS

FIELD OF THE INVENTION

This invention relates generally to a distributed data processing system for performing data coding and prediction. In particular, this invention teaches a data coding and/or prediction process implemented in a distributed data processing system capable of dynamically utilizing all the optimally selected segments of past symbols, i.e. contexts, in a parallel manner whereby encoding and prediction can be expeditiously performed.

DESCRIPTION OF THE PRIOR ART

Data compression refers to the process of transforming a stream of data to a smaller or "compressed" form from which the original, or some approximation of it, can be computed at a later time. Reversible or "lossless" data compression is achieved when data in a compressed form can be subsequently decompressed to the original form. "Lossy" data compression allows the decompressed data to vary from the original on condition that the decompressed data preserves the essence of the original by satisfying some fidelity criterion. Although the cost of storage has declined rapidly, and continues to do so, use of data compression techniques in most cases further reduces the effective cost by allowing more data to be stored in the same space. Furthermore, compressed data can be transmitted at a higher rate, which becomes important in various applications involving communication channels, given bandwidth constraints of the channel.

The relationship between probabilities and codes was established in Shannon, "A Mathematical Theory of Communication," Bell Syst. Tech. Journal, Vol. 27, pp. 398–403, July 1948, where it is shown that a symbol which is expected to occur with a probability p is best represented in $-\log p$ bits, the base of the logarithm being 2. Hence, a symbol with a higher probability is coded in fewer bits, whereas a less probable symbol requires more bits for coding. The expected code length is obtained by averaging over all possible symbols, i.e., $-\Sigma p_i \log p_i$, which is called the entropy of the probability distribution. According to Shannon's coding theorem, entropy imposes a lower bound on the mean number of bits required for the coded messages. For each given distribution, there exist techniques for the design of codes with which the limiting performance, the entropy, can be achieved to any desired accuracy. Among such are the classical Huffman code and the more recent and more flexible arithmetic encoders; see Rissanen and Langdon, "Universal Modeling and Coding," IEEE Transactions on Information Theory, Vol. IT-27, No. 1, pp. 12–23, January 1981. Arithmetic coding can be applied to any model whatsoever, including adaptive ones in which the distributions may be updated as the string is being processed. However, entropy is a property of the distribution "modeled" for the symbols or, more generally, messages. Since this bound cannot be reduced by any code design without altering the model, the critical task in any data compression is the search for the most efficient model. The efficiency of a model, in turn, depends on how much "contextual knowledge" is used.

There are two seemingly different ways to capture the "contextual information." The first is to collect long segments or "phrases" of the original symbols as a sort of dictionary, which can be done once and for all with respect to each type of string to be collected, or tailored adaptively to each individual string. When one of these phrases is subsequently detected in the string, it may be encoded simply as a pointer to the stored list of the segments. In the case of a natural language, a phrase may be a word, part of a word, or several words. Since the phrase can be replaced with a pointer so long as it has occurred once before in the text, the coding process in an adaptive version adapts quickly to any new topic. The most prominent dictionary models include the adaptive dictionary modelers-encoders by Ziv and Lempel. The essence of the Ziv-Lempel data compression schemes is an earlier method by Tunstall, originally designed for the so-called Variable-to-Fixed-Length-Coding; Tunstall, "Synthesis of Noiseless Compression Codes," PhD dissertation, Georgia Institute of Technology, Atlanta, Ga., September 1967. In this method, a desired number of the segments are stored as leaves in a tree, which is adaptively constructed pursuant to Tunstall's principle of always splitting the leaf with the highest probability. The leaves in the final tree therefore tend to have equal probability; each leaf can be efficiently encoded simply by its binary ordinal number. See, for example, Ziv and Lempel, "A Universal Algorithm for Sequential Data Compression," IEEE Transactions on Information Theory, Vol. IT-23, No. 3, pp. 337–343, May 1977; Ziv and Lempel, "Compression of Individual Sequences via Variable-Rate Coding," IEEE Transactions on Information Theory, Vol. IT-24, No. 5, pp. 530–536, September 1978; Eastman et al., "Apparatus and Method for Compressing Data Signals and Restoring the Compressed Data Signals," U.S. Pat. No. 4,464,650, Aug. 7, 1984.

The dictionary is thus a list of "phrases" that are expected to occur frequently. Indices are chosen so that on average they take less space than the original phrases to encode. The distinction between modeling and coding is necessarily blurred in dictionary methods since the codes do not usually change, even if the dictionary does. The main differences among various versions of the Ziv-Lempel methods relate to how far back a pointer can reach, and to which phrases or substrings may be the target of the pointer. Each combination of choices represents some compromise between speed, compression and memory requirements. A disadvantage of many of the dictionary schemes is that their implementation allows fast decoding but slow encoding. In many applications, such as the use of a file backup system, it is desirable to perform fast encoding of a large number of files, whereas it is of much less concern if decoding is slow.

The second general method to use contextual information is to gather occurrence counts of the original symbols in suitably selected contexts, of which a typical example is the first-order binary Markov process. To take an extreme case, in the alternating string 0101010101 . . . there are equal number of occurrences of both symbols, and hence relative to such an independent model the strings would have the maximum entropy 1 per symbol. However, if we calculate the symbol occurrences in the context of the preceding symbol, we see that in the context of 0 the next symbol is always 1, while in the context of 1 the next symbol is always 0, which results in zero entropy. It has been shown in the above given reference by Rissanen and Langdon, "Universal Modeling and Coding," IEEE Transactions on Information Theory, Vol. IT-27, No. 1, pp. 12–23, January 1981, that any dictionary type model, including the Ziv-Lempel ones, can be simulated as a context model, while the opposite is not true. Hence it can be said in a definite sense that all models are context models; the dictionary ones are special only in the particular way the contexts are gathered and the coding done, which generally favors decoding speed at the cost of encoding speed and compression. In summary, then, a model is essentially a collection of probability distributions, one for each context in which a symbol may be coded. Choosing the most appropriate contexts, storing them, and gathering the probability distribution for each occurrence of the symbols in these contexts are the critical tasks in modeling. Furthermore, a good model is usually an adaptive one which changes or adapts as a given message is encoded so that it better suits the specificity of that message.

There is an obvious difficulty in constructing context models in a primitive way. Since a context must be fairly long in terms of the number of symbols for it to be efficient, there would be an explosion of the storage space if each possible context were stored. However, in 1983 a new technique referred to as "Context" was introduced in Rissanen, "A Universal Data Compression System," IEEE Transactions on Information Theory, Vol. IT-29, No. 5, pp. 656–664, September 1983. The Context method (hereinafter referred to as the "Context Algorithm") collects in tree form only the contexts that actually occur in the string. Moreover, once a ranking of importance of the past symbols in influencing the symbol currently being examined has been determined, Context Algorithm collects essentially all the possible contexts in which the symbol has occurred. Hence, with this ranking of importance, Context Algorithm finds all the statistical information there is in the string. Once the possible contexts are found and the occurrence counts of the symbols in them gathered, the remaining task is to find for each symbol the optimal context for its coding. This selection was done by incorporating Rissanen's Minimum Description Length (MDL) principle in Rissanen, "Complexity of Strings in the Class of Markov Sources," IEEE Transactions on Information Theory, Vol. IT-32, No. 4, pp. 526–532, July 1986, into Context Algorithm. Rissanen also proved that for strings generated by any Markov source the resulting compression cannot be improved upon by any data compression system whatsoever. On the other hand, a Ziv-Lempel data compression system does not achieve this optimal compression and hence is provably inferior as far as compression is concerned. It has been found empirically that the compression obtainable with the Context Algorithm is typically 15% better than that obtainable with a Ziv-Lempel algorithm. This is a major gain in data compression applications. For example, in a comparison for three typical text files, the first two taken from two instruction manuals and the third from a stored directory type file, Context Algorithm compresses the files from 7665, 6979 and 3457 bytes, respectively, to 3085, 3046 and 1297 bytes, respectively, whereas a Ziv-Lempel algorithm requires 3505, 3457 and 1469 bytes, respectively.

A major drawback in the original implementation of Context Algorithm is that it is sequential, which results in time complexity of O(n log n) for an input string of length n. Because this is considerably slower than the desired time complexity, i.e., O(n), it has been an obstacle for using this otherwise superior data compression scheme in a number of important applications where speed is of the essence. The present invention among other things removes this obstacle in part, for it permits an implementation of a context-based algorithm, such as Context, without an explicit use of the tree structure, which results in encoding and prediction in time complexity O(n), which obviously is optimal in the order of magnitude. The same implementation, however, does not work in decoding, which still requires the time O(n log n). As far as speed is concerned, the dictionary-based compression systems and the context-based systems of the present invention are complementary inasmuch as decoding in dictionary systems can be done in time O(n) while the encoding is slower, taking time which depends on the size of the dictionary being used.

Furthermore, the present invention is not restricted to only data compression. Among the important applications outside data compression is prediction, which requires contexts and their distributions as much as coding, but where no "decoding" is required. Moreover, prediction often must be done as fast as possible when the information about the latest context has become available, because subsequent action such as control depends on the predicted value and must be executed swiftly. Moreover, prediction on a gigantic scale, such as weather prediction, requires the use of distributed processes of the kind disclosed herein. Further potential applications of the disclosed scheme are virtually all forms of model building, either for prediction or other purposes. Such include models of time series and chaotic processes, where again speed is generally of great importance.

Before proceeding with a complete description of the preferred embodiment of the present invention, a sequential implementation of the Context Algorithm is first described. Thus, FIG. 1 shows a single data processing element (DPE) 100 whereto a string of data 102, i.e., $x=x_1x_2 \ldots x_i$, comes in a sequential manner, i.e., one data item (or symbol) at each clock cycle. The data string is fed to an input buffer 104 and processed by a central process unit (CPU) 106 with a memory 108. For the purpose of explanation it is assumed that the data string 102 is a string of binary bits, i.e., $x_i$, i=1,2, ..., is either zero or one. The method is however applicable to other types of data strings and is not limited to a binary string only.

For the purpose of coding or prediction, a tree data structure 210, i.e., T, is constructed for the incoming data string 102 and shown in FIG. 2. The tree structure 210 comprises a plurality of context nodes 212 each corresponding to a context, i.e., a string segment used for coding or prediction. The tree structure 210 forms an up-down structure wherein the upper nodes 212 get constructed earlier in time sequence and are therefore generally referred to as the "father" or "ancestry" nodes, while the lower context nodes in the structure are constructed later in time sequence and are often referred to as "son" or "offspring" nodes. A context node 212 is a "leaf" node if it has no "offspring" nodes. Otherwise the context node 212 is an "internal node."

The growing tree structure 210 is constructed recursively by applying the Context Algorithm on the growing data string. The data tree 210 has a plurality of branches wherein a branch to the left of the path corresponds to a bit zero and a branch to the right corresponds to a bit one. While constructing the data tree, the DPE 100 of FIG. 1 also maintains a pair of counters for each context node 212. The definition of this pair of counters and their use in constructing the data tree structure 210 will be described below.

For the purpose of explanation, the "status" of the data tree 210, including the configuration of the tree structure, the values of the pair of counters and the context in each context node 212, is denoted by a function T(t) upon processing the data string 102 of $x_1x_2 \ldots x_i \ldots x_p$, wherein the last context node 214 of the data tree 210 has a context $z=z_1z_2 \ldots z_m$ where $z_i=x_{t-i+1}$ for i=1,2, ..., m, or, more generally, $z_i=x_{t-\pi(i)}$, where $\pi(1), \ldots, \pi(m)$ denotes any set of non-negative indices. The status of the data tree T(t) is therefore represented by the integration of all the context-relevant data generated for each context node 212. A pair of counters c(z,1) and c(z,0) is maintained by the DPE 100 for the context node 212 to represent the numbers of times the processed symbols in the past string, which had the context z, had the value 1 and 0, respectively. More precisely, the values of the counters $c(z,u)$, $u=0, 1$, are updated at each clock cycle, and are the number of indices j such that the string $x_{j-m} \ldots x_{j-1}u$ occurs as a substring in $x_1x_2 \ldots x_t$, where $x_{j-1}x_{j-2} \ldots x_{j-m}=z$. Notice that the ordering of the symbols in z is reversed in time because a context refers to a string into the past.

The probability of the event $x_t=b$, when $x_t$ occurs in the context $z=x_{t-1} \ldots x_{t-m}$, is calculated, for example, by the following Laplacian estimator $$P_t(b|z) = \frac{c_{t-1}(z,b) + 1}{c_{t-1}(z,b) + c_{t-1}(z,\bar{b}) + 2}$$

where $\bar{b}=1-b$. Other predictive estimators may also be used.

The following steps are executed by the CPU 106 for the construction of the data tree structure 210:

1. Before the first bit of the data string 102 is received by the input data buffer, start with T(0) by assigning to the root 216 an empty context $\lambda$ and setting $c(\lambda,0)=c(\lambda,1)=1$, in case the above Laplacian estimator is used.

2. Given T(t−1), where t=1 initially, climb the tree along the path defined by $x_{t-1}x_{t-2} \ldots$. For each node z visited along the path, where $z=\lambda$, $z=x_{t-1}$, $z=x_{t-1}x_{t-2}, \ldots, z=a$ leaf, increment the counter $c(z,x_t)$ by 1. If the value of the counter $c(z, x_t)$ of a leaf node is 2 after the incrementation, create two descendant nodes, one for each branch, and set both of their symbol counts to 1.

3. Compute the probability $P(b|z)$ as defined by the above equation for each context node 212.

If the incoming data string in the above steps is of a type other than binary, e.g., a decimal data string, each context node 212 of the data tree structure 210 may have more than two branches, e.g., up to ten branches for a decimal data string, depending on the context as generated for each node and the value of the counters in each context node 212.

During the above process, a plurality of contexts, one for each context node 212, are generated, each having a probability $P(b|z)$ as defined by the above equation. This set of data can be flexibly applied to data coding and prediction. In the case of data encoding, generally referred to as data compression, the minimum descriptive length (MDL) principle can be applied in the selection of a distinguished context, $z_t^* = x_1x_{t-1} \ldots$, along each path in the tree in which the encoding of the symbols is performed. A simplified version of this to be used below picks this node as the one where $P(0|z)$, as computed by the above equation, deviates the most from ½. To predict the next symbol of the incoming string, the most straightforward way is to pick the symbol for which the probability $P(b|z_t^*)$ has the highest value.

The processing of an input string 102 by the use of the Context algorithm in a sequential manner, as described above, involves a step-by-step procedure for comparing the input string 102 with the context in each context node 212, incrementing the counters, and computing the probability at each node. For each incoming string, it requires on the average log(t) time steps to reach a context node with a context length of t bits. The overall time complexity in the worst case is therefore O(n log n) for a string of n bits.

SUMMARY OF THE INVENTION

It is therefore an object of the present invention to provide a distributed data processing system comprising a plurality of data processors to simultaneously utilize all the optimally selected segments of past symbols, i.e. the contexts, whereby encoding and prediction can be expeditiously performed.

It is another object of the present invention to provide a distributed data processing system comprising a plurality of data processors each generating a context correlating to a data tree structure for coding and/or prediction, whereby a hierarchical database search over the tree structure for past context data is performed implicitly and in parallel.

It is a further object of the present invention to provide a distributed data processing system, e.g., a systolic array, comprising a plurality of data processors wherein Context Algorithm is simultaneously and independently executed in each processor with information and knowledge of all past coding history and relative coding efficiency to dynamically generate the optimal contexts for coding and prediction.

It is a further object of the present invention to provide a distributed data processing system comprising a plurality of data processors for coding and prediction using Context Algorithm wherein the number of processors may be flexibly adjusted depending on the compression ratios required for each particular application.

Briefly, a preferred embodiment of the present invention comprises a distributed data processing system capable of adaptively processing an incoming data string in an adaptive, time-progressive manner. The distributed data processing system further comprises a plurality of processors each including at least a data storage means for storing a plurality of data. Each of the processors further includes a data processing means capable of processing the data in the storage means and adaptively generating a set of context-relevant data. Thus each processor, having access to the incoming data string and the sets of context-relevant data and operating individually or in conjunction with one or more other processors, performs coding or prediction for the incoming data string in an adaptively optimal manner.

An advantage of the present invention is that it provides a distributed data processing system comprising a plurality of data processors to simultaneously utilize all the optimally selected segments of past symbols, i.e. the contexts, whereby encoding and prediction can be expeditiously performed.

Another advantage of the present invention is that it provides a distributed data processing system comprising a plurality of data processors, each generating a context correlating to a data tree structure for coding and/or prediction, whereby a hierarchical database search over the tree-structure for past context data is performed implicitly and in parallel.

Another advantage of the present invention is that it provides a distributed data processing system, comprising a plurality of data processors, wherein Context Algorithm is executed in each and every data processor to generate, in an adaptive and time-progressive manner, optimal contexts for coding and prediction.

Another advantage of the present invention is that it provides a distributed data processing system comprising a plurality of data processors for coding and prediction using Context Algorithm wherein the number of processors may be flexibly adjusted depending on the compression ratios which may vary as a function of the particular application.

A further advantage of the present invention is that, instead of involving time complexity of O(nlogn) in a sequential implementation of a modeler-encoder, the distributed parallel-processing implementation calls for the much reduced time complexity O(n) in encoding and/or prediction. This applies in particular to the parallel implementation of the prior art algorithm Context for which reduced time complexity O(n) is achieved.

These and other objects and advantages of the present invention and the manner of obtaining them will no doubt become apparent to those of ordinary skill in the art after having read the following detailed description of the preferred embodiment, which is best understood by reading the detailed description in conjunction with the various accompanying drawings.

DESCRIPTION OF THE PREFERRED EMBODIMENT

Figure 3:
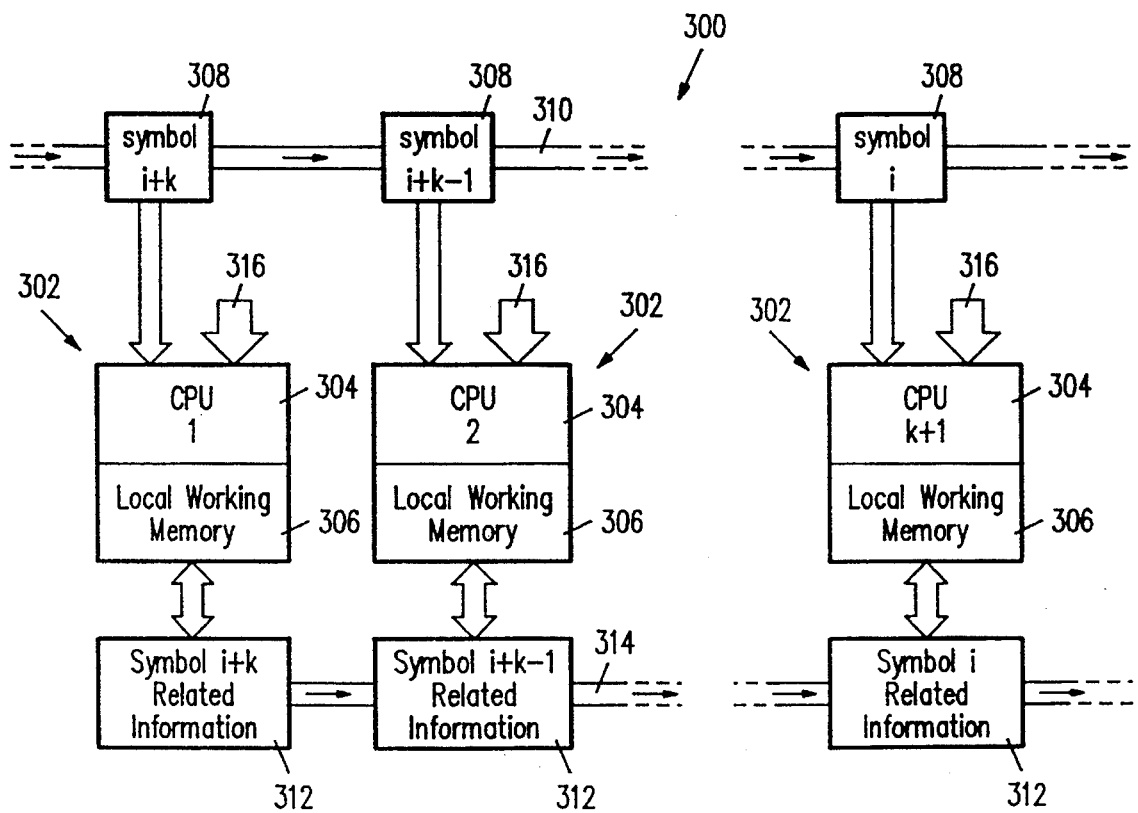
FIG. 3 is a schematic illustration of the implementation of a context-based model on a distributed array data processing system.
Figure 4:
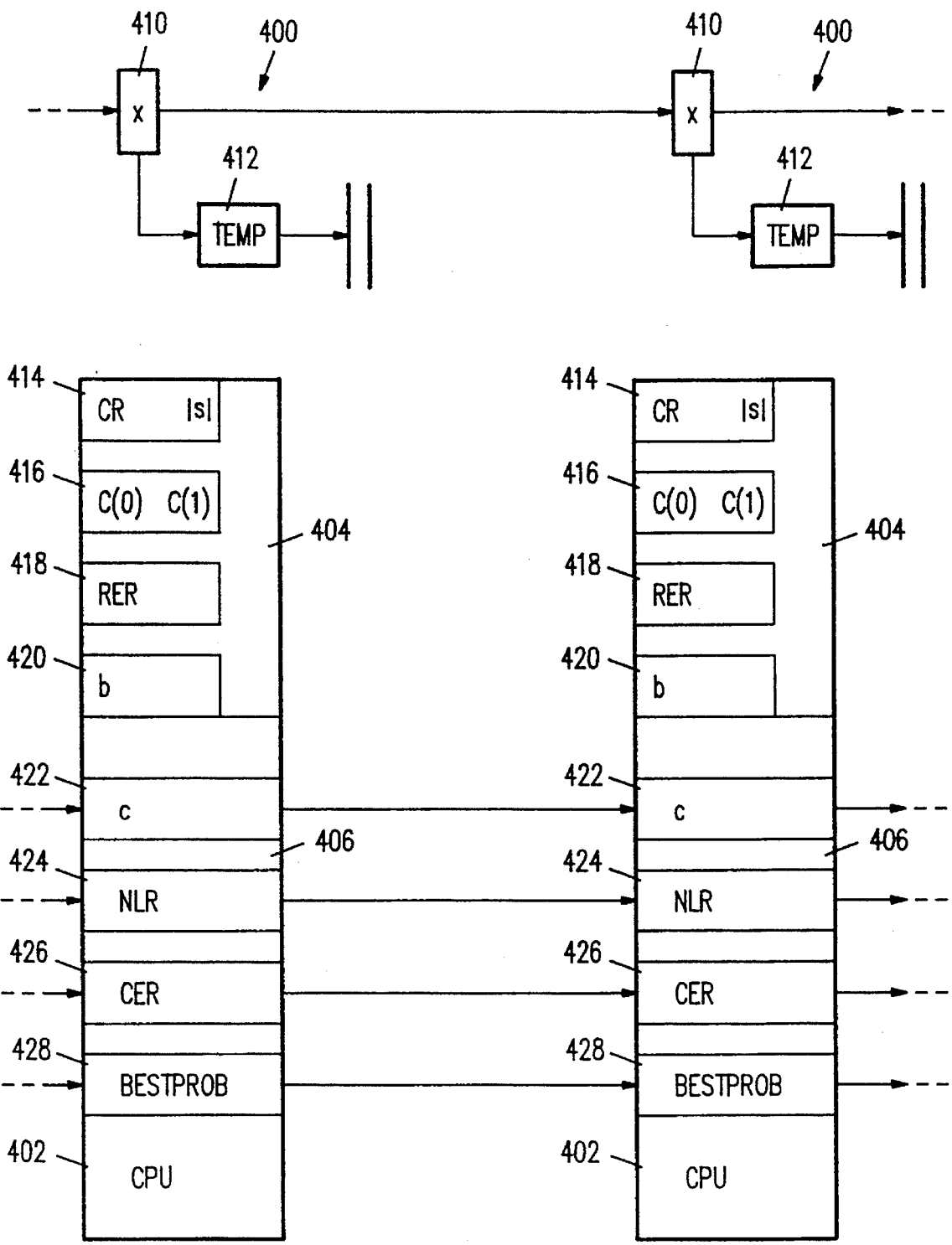
FIG. 4 is a schematic illustration of two adjacent DPEs of a distributed array data processing system wherein a context-based model may be implemented for encoding and/or prediction.

While the present invention may be embodied in many forms, FIGS. 3 and 4 depict particular embodiments, with the understanding that the present disclosure is not intended to limit the invention to the embodiments illustrated.

In accordance with one aspect of the present invention, a distributed data processing system comprising a plurality of data processing elements (DPEs) expeditiously processes an incoming data string of symbols pursuant to a context-based model in an adaptive and time-progressive manner. Each DPE, having access to a symbol at each clock cycle and adaptively generating context-relevant data sets, works individually and/or in conjunction with one or more other DPEs to perform encoding or prediction based on the past data strings, such that an input symbol and its best model for encoding/prediction emerge concurrently from the distributed data processing system, resulting in much reduced time complexity in comparison to a sequential implementation of the same context-based model.

In accordance with a further aspect of the present invention, a systolic array data processing system comprising a plurality of data processing elements (DPEs) expeditiously processes an incoming data string of symbols pursuant to a context-based model in an optimal and time-progressive manner. As each symbol of the data string passes through the systolic array, a multitude of contexts, i.e., segments of varying lengths of recently processed symbols, each stored at a corresponding DPE, are examined. One of the contexts is selected pursuant to a specific criterion, e.g., the Minimum Description Length (MDL) principle, as the optimal model for making encoding/prediction, and emerges from the systolic array along with the symbol itself, resulting in much reduced time complexity in comparison to a sequential implementation of the same context-based model.

The DPEs in the present invention can be any processor from a mainframe to an elementary processor of a systolic array. Even though the present invention for prediction and coding requires only mono-directional links, bidirectional communication links (e.g., networks or buffers) allowing each DPE to receive information from or send information to other DPEs are permissible. All links between DPEs are of length O(1), i.e., constant, so that the time for two adjacent DPEs to communicate is also O(1). Information is transmitted from one DPE to the next in sequence in a mono-directional way in a FIFO (First In, First Out) process. The number n of processors in the array is determined by implementation considerations such as cost.

In accordance with a particular embodiment of the present invention, referring to FIG. 3, a plurality of DPEs 302, each having its own CPU 304 and working memory 306, are ordered in a linear array or "pipeline" 300. The array 300 processes a data string pursuant to a particular context-based model, e.g., Context algorithm. The DPEs 302 are arranged linearly such that each DPE 302 is connected to at most two neighboring DPEs 302. Each DPE 302 is also connected to a symbol register 308 holding the current symbol of the input data string. The plurality of the symbol registers forms an "upper" pipeline 310. Each DPE 302 is further connected to a pipeline memory 312 containing various information relating to the current symbol occupying the symbol register 308. The plurality of the pipeline memories forms a "lower" pipeline 314. Even though the symbol register 308 and the pipeline memory 312 are shown, for illustration purposes, as elements separate from the DPE 302, all three may integrally form a data processing unit which is an essential part of the linear array 300. In addition, an arithmetic encoder (not shown) may be connected downstream to the right of the array 300 for encoding purposes. The role played by the arithmetic encoder has been described in the Description of the Prior Art.

In this context, an implementation of a context-based encoder/predictor in a distributed array 300 for an expeditious execution at the rate of one string symbol per clock cycle is described in broad terms as follows. Consider a data string $x_1 x_2 \ldots x_i \ldots$ to be processed by the distributed array 300 depicted in FIG. 3. Each symbol is fed, one at a time, into the first (or leftmost) symbol register 308 after each of the previous symbols propagates one step downstream, i.e., to the right, in the upper pipeline 310. Thus, if the ith symbol $x_i$ is above the first DPE 302, $x_{i-1}$ will be above the next DPE 302 to the right, and so on. Each DPE 302 has a context register 316 for storing a unique context, defined as the collection $s = y_1 y_2 \ldots y_k$ of the immediately preceding symbols of the symbol $x_i$ which happens to be above the DPE 302 at the time this DPE 302 is "created." Notice that the DPEs 302 of the array are "created", or employed, from left to right as the string of symbols arrive. Thus, $y_1 = x_{i-1}, \ldots, y_k = x_{i-k}$ if $x = x_i$, where k is selected for each DPE 302 in a growing fashion. The maximum value of k is determined by the largest contextual information one wishes to include in the system and is also set pursuant to implementation considerations; see also the binary case below.

Figure 1:
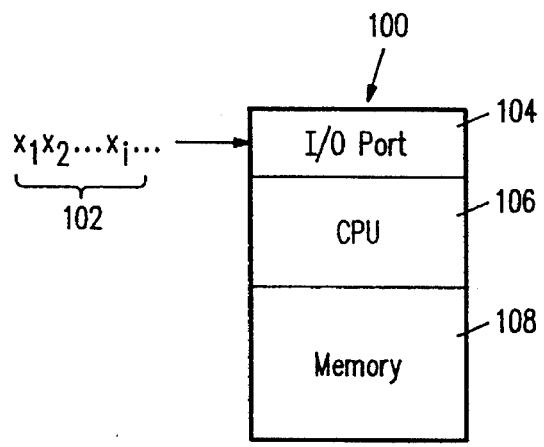
FIG. 1 is a schematic illustration of a sequential implementation of a context-based model on a single data processing element.
Figure 2:
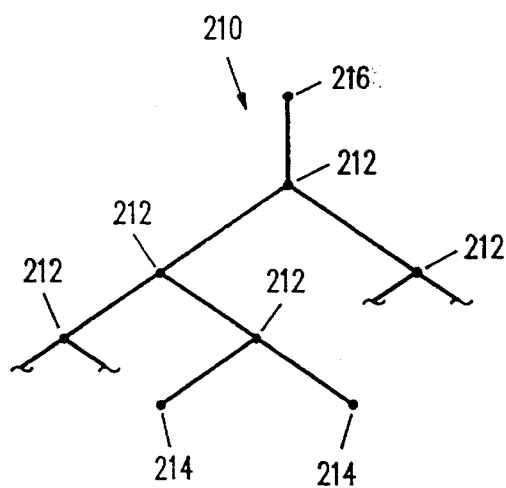
FIG. 2 is a schematic illustration of a data tree structure showing a plurality of context nodes wherein each node contains a context for coding and/or prediction.

The context s corresponds to a "node" of a data tree, such as the one depicted in FIG. 2. As time goes on, the context associated with a DPE 302 at its creation does not change, whereas the symbol above it (i.e., occupying its corresponding symbol register 308), those symbols to its right, as well as the contents of various registers in its working memory 306 and its corresponding pipeline memory 312, may all be constantly changing. Hence each employed DPE 302 of the array 300 corresponds to a node of the data tree.

During the processing of an input data string, the DPEs 302 of the array 300 first go through an initialization process including the assignment of an empty string to the first DPE and an undefined context to each of the other DPEs; the details will be described in the binary case to follow. Each DPE 302 then performs various operations in its working memory 306 as well as in the corresponding pipeline memory 312 pertaining to encoding and/or prediction based on the string preceding the current symbol occupying the corresponding symbol register 308. These operations may include a comparison between this past string and the context of the DPE 302, a decision of whether or not to increment the count of the current symbol by one, i.e., whether to update symbol statistics, a decision of whether or not to "create" a DPE 302 (or node) to store a new, relevant context, the computation of the predictive estimators and the determination of the optimal or best model for the current symbol, the selection of the number k, and so on, and will be thoroughly discussed in the binary case to follow. Thus, instead of comparing an input data string with the context in each node of the data tree at the rate of one comparison per clock cycle, resulting in time complexity of O(n log n) in the worst case for an input string of length n, such as in the case of the above-described sequential implementation of Context Algorithm, the DPEs 302 of the distributed array 300 of the present invention execute various operations including the above comparisons at the same time as an input symbol passes through the "pipeline" 300. The net result is that as a symbol emerges from the right end of the upper pipeline 310, its best prediction or encoding emerges concurrently from the right end of lower pipeline 314, resulting in time complexity of O(n) for an input string of length n. In this way, the DPEs 302 of the present invention individually and jointly perform an expeditious process of encoding and/or prediction based on an incoming sequence of symbols in an adaptive, time-progressive manner.

Before a particular embodiment of the present invention for binary input strings is described, a discussion of the prediction processes is in order. In general, two types of prediction processes are of interest. In the first type a single prediction of some quantity is made as a function of its past value as well as the past or present values of other quantities. In the second, successive prediction of each observation from the past observations is needed before the very observation itself is made.

The first case can be handled with the aforementioned array 300 by simply feeding empty values into the system after the last available observation and replacing the codes in the pipeline memory 314 by the predicted value. The first time the empty value emerges from the right end of the upper pipeline 310, the value emerging from the right end of the lower pipeline 314 gives the desired prediction. In the second case, the immediately preceding values of each to-be-predicted symbol $x_i$ must also be supplied along with the past values of the symbols above the DPE. Hence each DPE has access to the same string of past values. This means that the upper pipeline 310 consists of several parallel buses, the first carrying the last observed symbol, the second the immediately preceding symbol, the third the previous symbol, and so on, up to a maximum value w determined by the largest contextual information one wishes to include in the system.

For each symbol entering the array 300, the selection of the optimal node (or context) in which prediction is made is the same as in the case of coding, as will be discussed in detail in the following binary case. Furthermore, to deliver the best prediction, the lower pipeline 314 must be expanded to a bus with as many lines as the maximum context length. Thus, the first line stores the predicted value made by the leftmost DPE. The second line stores the prediction made by the DPE which stores a 1-bit context, and so on. The final prediction is the deepest (i.e., the last) line that has a non-zero value stored in it.

Since the encoding/prediction for a binary data string is a simple but commonly encountered case, a particular embodiment over a binary alphabet is described in detail hereinafter.

Referring to FIG. 4, showing two adjacent DPEs 400, each DPE 400 is associated with a context s and comprises a CPU 402 and data storage means comprising a local memory 404 and a pipeline memory 406. The DPE 400 also comprises the following registers:

1. a 1-bit symbol register 410 for holding an input symbol x; this register 410 is by definition a "pipeline register" because it is connected to the symbol register 410 to its right, and so on, forming a "pipeline" resembling the upper pipeline 310 of FIG. 3;

2. a q-bit temporary-storage register 412 for holding the q symbols that precede x; TEMP denotes the symbols occupying the temporary-storage register 412.

In the specific arrangement of FIG. 4, the temporary-storage register 412 duplicates the q symbols of the input string to the right of the current symbol x occupying the symbol register 410 of the DPE 400. As time goes on the context associated with each DPE at its creation does not change, even if the symbol in the symbol register 410, those to the right of this DPE 400, as well as TEMP, may be constantly changing. Thus, the context may be used as the address of the corresponding DPE 400, i.e., the first DPE is associated with the first context, the second DPE is associated with the second context, and so on.

The local memory 404 further comprises various registers and counters described as follows:

1. a context register 414, including a q-bit portion denoted by CR, for holding a context s corresponding to a specific node of the data tree, as well as a number of extra bits for holding the length of the context |s|, where $|s| \leq q$;

2. two symbol-probability counters 416, their values denoted by C(0) and C(1), for counting the number of times the binary values 0 and 1 have occurred, respectively, in the context s;

3. a d-bit relative-efficiency register 418, its value denoted by RER, for holding the relative efficiency of the node associated with s with respect to its father node; and 4. a binary node-status flag 420, its value represented by b, indicating the status of the node, i.e., whether it is a leaf (b=0) or an internal node with two successive nodes (b=1).

The pipeline memory 406 further comprises the following "pipeline registers", all of which are initialized to 0:

1. a new-node flag 422, its value represented by c, where c=1 signals the need to create a new context (and thus a new node) by extending the current context by an extra bit; specifically, the extra bit is 0 when the DPE 400 is even-numbered, and the extra bit is 1 when the DPE 400 is odd-numbered.

2. a q-bit node-length register 424, its value denoted by NLR, for propagating the length of the context to be associated with the new nodes;

3. a d-bit coding-efficiency register 426, its contents denoted by CER, for propagating the coding efficiency from "father" to "son"; and 4. an e-bit best-probability buffer 428, its value denoted by BESTPROB, for the selection of the best model for the input symbol x occupying the symbol register 410.

Notice that each of the above four registers is connected to its counterpart to the right, and so on, forming "pipelines" essentially resembling the lower pipeline 314 of FIG. 3.

The parameter q must be correlated with n and be pre-determined, along with precision parameters d and e, by implementation considerations such as cost. A typical value for q, d or e is 32 (i.e., the maximum context length and the precision parameters are 32 bits.)

Having described the distributed array data processing system of a preferred embodiment wherein a context-based model can be implemented, the details of implementation of a specific context-based model, i.e., Context Algorithm, on this array for the case of a binary alphabet is provided as follows. Essentially, the symbols of the sequence to be processed enter the array, one symbol per clock cycle, and progress in the symbol registers 410 from the left to the right in a time-progressive manner. Regardless of the particular location of a DPE 400 in the array, the contents of the five pipeline registers, i.e., the symbol register 410, the new-node flag 422, the node-length register 424, the coding-efficiency register 426, and the best-probability buffer 428, all advance one DPE to the right at each clock cycle. On the other hand, the contents of temporary-storage register 412 shift one position to the right at each clock cycle, whereby the rightmost bit is discarded and the leftmost, vacated position is filled with a copy of x. Flow charts depicting the implementation of Context Algorithm over a binary alphabet in a distributed array data processing system are shown in FIGS. 5–8.

Figure 5:
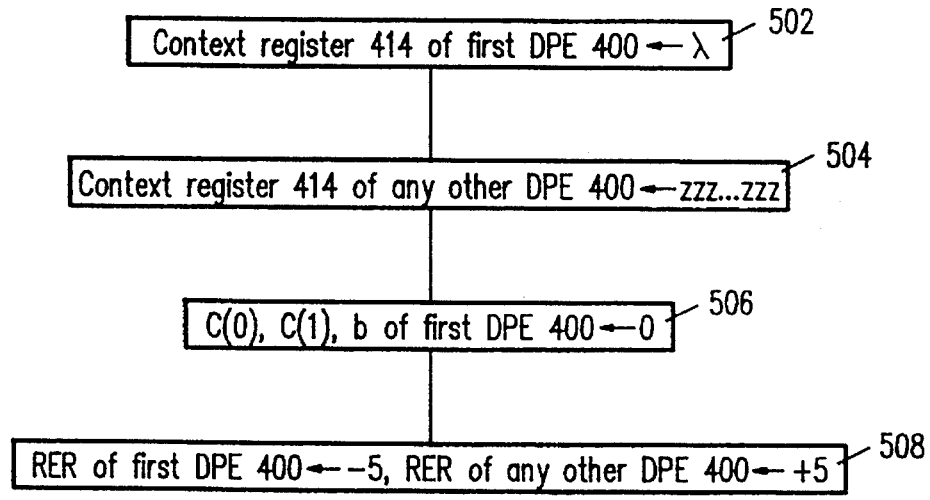
FIG. 5 depicts a flow chart for the initialization of DPEs of a distributed array data processing system wherein Context Algorithm may be implemented for encoding and/or prediction.

Referring to FIG. 5, depicting the initialization of DPEs, the context register 414 of the first (i.e., the leftmost) DPE 400 is initially assigned the empty context λ at step 502, whereas an undefined context zzz . . . zzz is assigned to the context register 414 of each of all other DPEs at step 504. The undefined context may be indicated by an extra bit position which is added to the context register and set to 0, whereas an extra bit position with a value of 1 indicates a defined context. At step 506, both C(0) and C(1) of the first DPE are set to 0; flag b is set to 0 as well (because there are no successive nodes yet). At step 508, the RER of the first DPE is assigned a negative value, for example −5, while the RER of any other DPE is assigned a positive value, for example +5. Notice that a simple criterion for selecting the best model for a symbol, i.e., an optimal context, is to choose the longest context (or node) with a negative RER. The RER of the first DPE 400 is always kept at the aforesaid negative value, guaranteeing that each symbol has at least the empty context in which the symbol will be encoded. This point will be further examined below.

Figure 6:
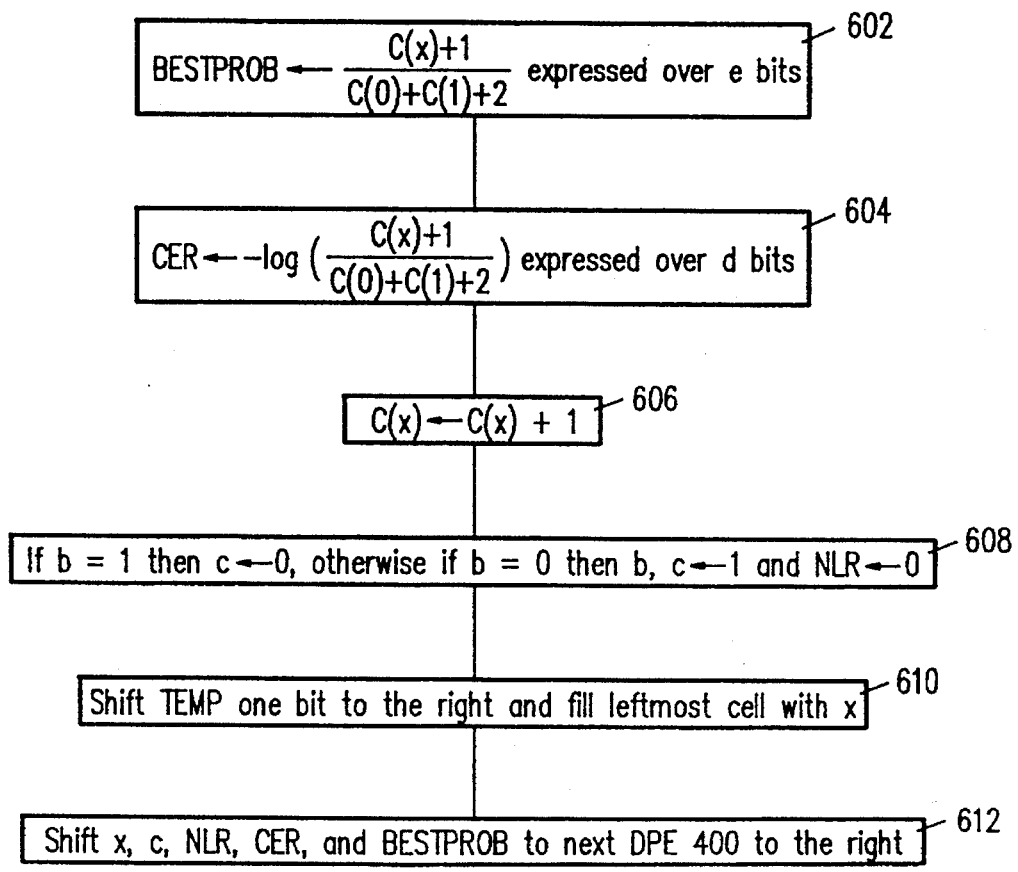
FIG. 6 depicts a flow chart for the activity of the first DPE of a distributed array data processing system wherein Context Algorithm may be implemented for encoding and/or prediction.

Referring to FIG. 6, the first DPE performs the following at each clock cycle: At step 602, compute the Laplacian estimator for the symbol x currently occupying the symbol register 410, namely, $$p = \frac{C(x)+1}{C(0)+C(1)+2},$$

and write it, expressed in e bits, into the best-probability buffer 428; at step 604, write the value −log(p), expressed over d bits, into the coding-efficiency register 426; at step 606, increment the symbol-probability counter corresponding to the symbol x, i.e., C(x), by one; at step 608, set c to 0 if b=1, or else set b and c to 1 and NLR to 0 if b=0; at step 610, shift TEMP to the right by one bit, and fill the leftmost cell of TEMP with the current input symbol x; and at step 612, the contents of all five pipeline registers, i.e., x, c, NLR, CER, and BESTPROB of a DPE 400 advance one DPE to the right.

Figure 7:
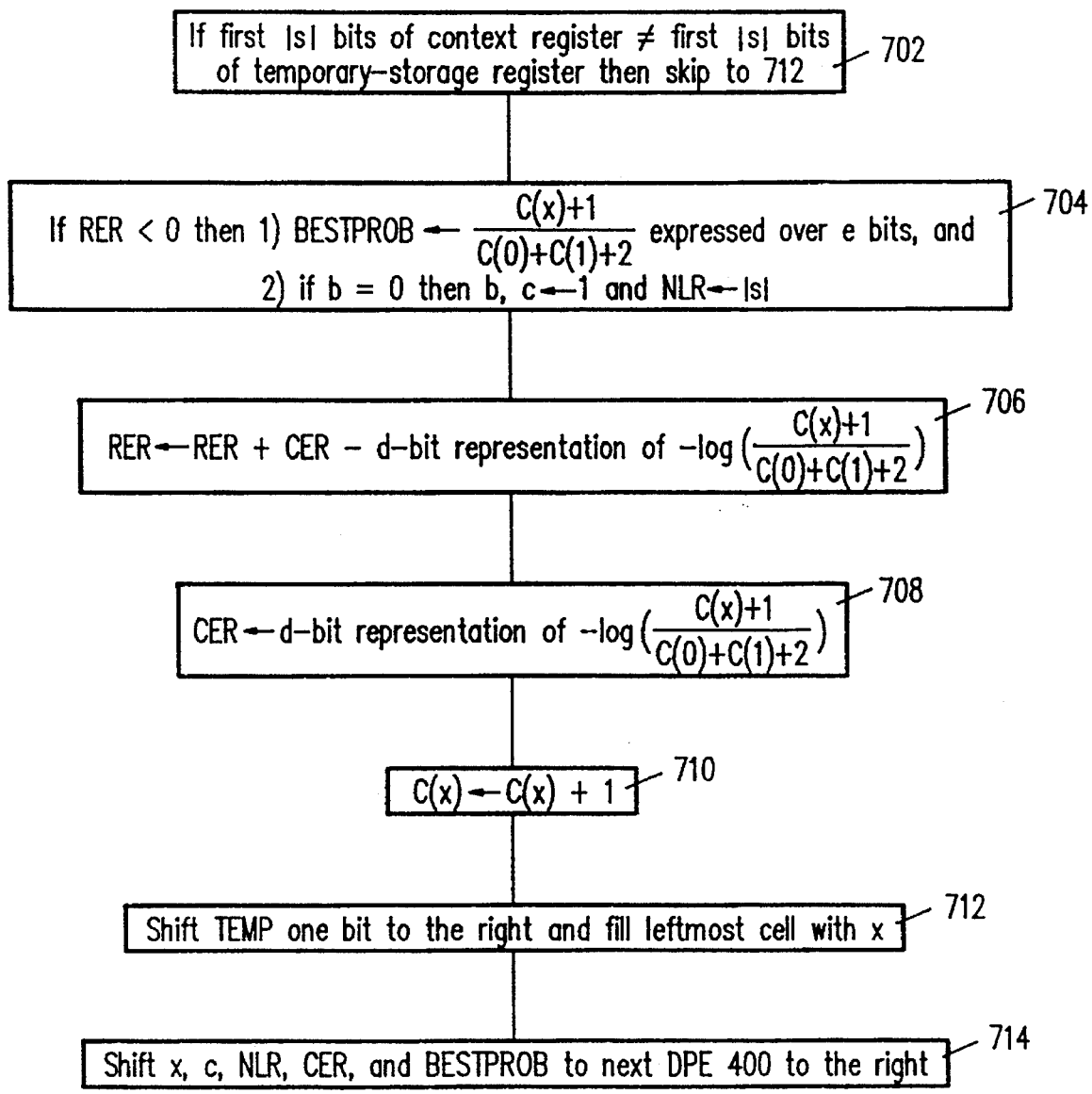
FIG. 7 depicts a flow chart for the activity at each clock cycle of a DPE which is not the first DPE and for which the contents of the context register is defined.
Figure 8:
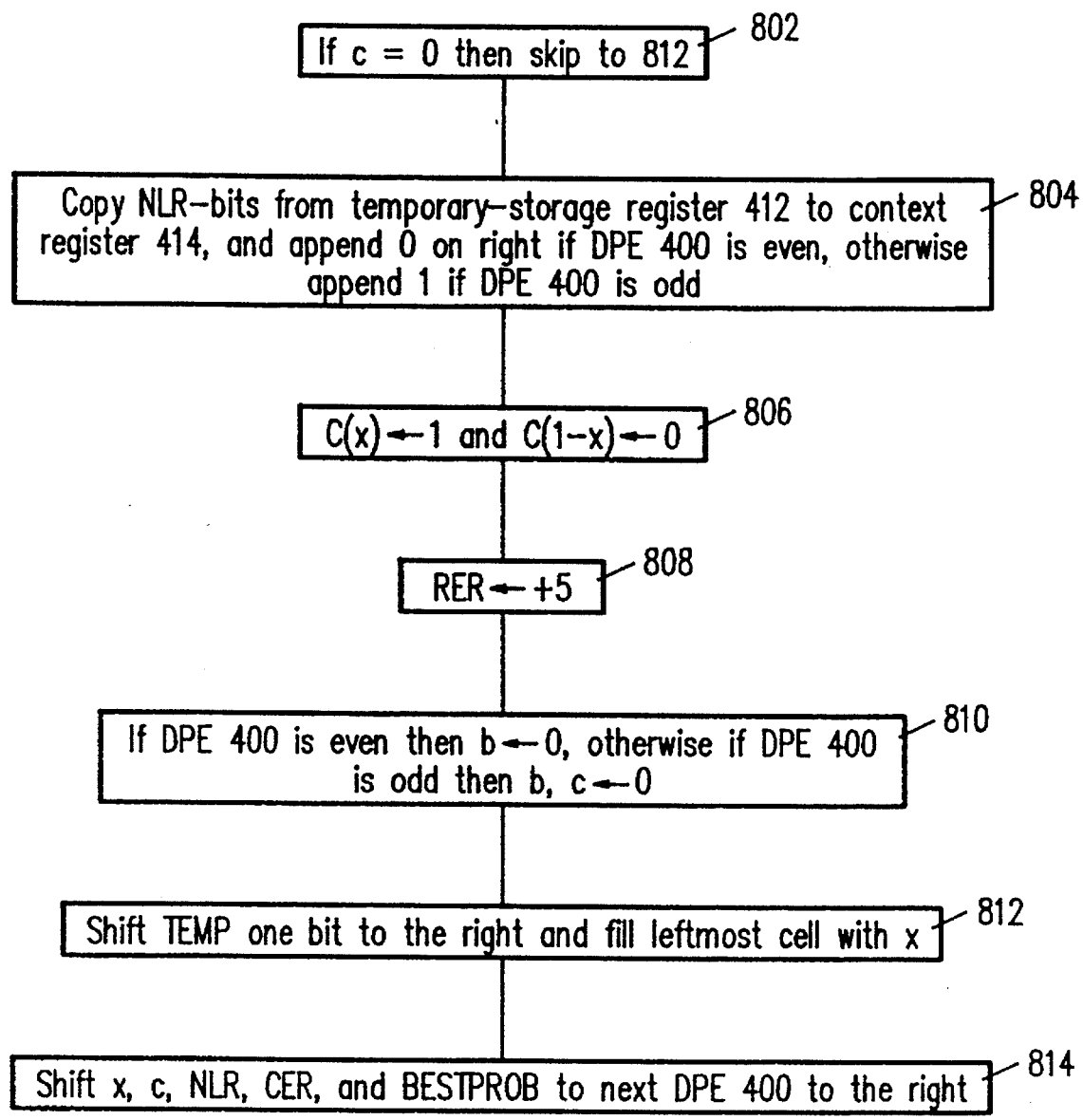
FIG. 8 depicts a flow chart for the activity at each clock cycle of a DPE which is not the first DPE and for which the contents of the context register is not defined.

FIG. 7 and. FIG. 8 refer to all except the first DPE 400. Referring to FIG. 7, depicting the activity of a DPE 400 the CR of which is defined, i.e., it contains a defined context, the DPE 400 performs the following at each clock cycle:

At step 702, compare the first |s| bits of CR and TEMP, and skip to step 712 if the two are not identical; the following steps 704 through 710 are executed if the above prefixes in step 702 are equal, i.e., x "occurs" in the context s associated with the DPE 400:

At step 704, compute the Laplacian estimator for the symbol x currently occupying the symbol register 410, namely, $$p = \frac{C(x)+1}{C(0)+C(1)+2};$$

if RER is negative, replace BESTPROB by the e-bit representation of p (notice that this is how the last relevant DPE 400 with a negative RER determines the model); if in addition b=0, set both b and c to 1 and set NLR to |s|, thus creating two son nodes of s, both of which appear to the right of s in the array; at step 706, add CER to RER and subtract from it the d-bit representation of −log(p); at step 708, write the above d-bit representation of −log(p) into the coding-efficiency register 414; and at step 710, increment C(x) by one.

Steps 712 and 714 are essentially identical to steps 610 and 612, respectively.

Referring to FIG. 8, depicting the activity of a DPE 400 the CR of which is yet undefined, i.e., it contains an undefined context zzz . . . zzz, the DPE 400 performs the following at each clock cycle:

At step 802, determine if c equals 0; if equality is found, skip to step 812; if c equals 1, the following will be performed: at step 804, copy NLR-bits from the temporary-storage register 412 to the context register 414 and concatenate either 0 or 1 to their right, depending on whether the DPE 400 is even- or odd-numbered, respectively, thus creating two new nodes, the context of each of which has a length of NLR+1 bits; at step 806, assign 1 to C(x) and 0 to C(1−x); at step 808, set RER to some pre-determined positive value; at step 810, set c=1 and b=0 for an even-numbered DPE and set c=b=0 for an odd-numbered DPE, indicating that a pair of son nodes has been created.

Steps 812 and 814 are essentially identical to steps 610 and 612, respectively.

For prediction applications, the desired output is just the value emerging out from the best-probability buffer 428 of the rightmost DPE 400. The arithmetic encoder then translates this emerging BESTPROB value into the appropriate output code for encoding applications.

Notice that the above descriptions, including FIGS. 4–8, are applicable for any finite alphabet so long as the number of symbol-probability counters 416 varies in accordance with the size of the alphabet.

While the above specific embodiments disclose the implementation of the Context Algorithm on a linear systolic array, it is also possible for those skilled in the art to implement, in the light of the above teachings, the Context Algorithm in other distributed or parallel processing environments. For example, those skilled in the art will recognize that the Context Algorithm can be implemented on other parallel processing architectures based on interconnection network topology including, but not limited to, a linear array, a de Bruijn graph, a d-dimensional mesh, or a hypercube.

Those skilled in the art will recognize that the foregoing description has been presented for the purposes of illustration and description only. It is not intended to be exhaustive or to limit the invention to the precise forms disclosed, and obviously many modifications and variations are possible in the light of the above teachings. Thus, the embodiments set forth herein are presented in order to best explain the principles of the present invention and its practical application to thereby enable others skilled in the art to best utilize the present invention in various embodiments and various modifications as are suited to the particular use contemplated.

What is claimed is:

1. A distributed data processing system for processing a data string comprised of a plurality of symbols, comprising:

a plurality of data processing elements (DPEs), each said DPE including a data storage means for storing a plurality of data and a data processing means for processing said data in said storage means;

each said DPE adaptively generating a set of context-relevant data and utilizing, individually or in conjunction with other said DPEs; at least one of said sets of context-relevant data to generate model information corresponding to said symbol;

wherein said data processing elements are successively employed as determined by said sets of context-relevant data.

2. The distributed data processing system of claim 1 wherein:

each said set of context-relevant data relates to a node of a data tree structure.

3. A distributed data processing system for processing a data string comprised of a plurality of symbols, comprising:

a plurality of data processing elements (DPEs), each said DPE including a data storage means for storing a plurality of data and a data processing means for processing said data in said storage means;

each said DPE adaptively generating a set of context-relevant data and utilizing, individually or in conjunction with other said DPEs, at least one of said sets of context-relevant data to generate model information corresponding to said symbol;

wherein said distributed data processing system is a systolic array.

4. The distributed data processing system of claim 3 wherein:

said systolic array is linear.

5. The distributed data processing system of claim 4 wherein:

said data string is transmitted from each said data processing element (DPE) to the next DPE of said linear systolic array in a time-progressive manner, wherein said DPEs are adaptively updated at each clock cycle.

6. A linear systolic array for processing a data string comprised of a plurality of symbols, comprising:

a plurality of linearly arranged data processing elements (DPEs), each said DPE including a data storage means for storing a plurality of data and a data processing means for processing said data in said storage means;

each said DPE adaptively generating a set of context-relevant data relating to a data tree structure and utilizing, individually or in conjunction with other said DPEs, at least one of said sets of context-relevant data to generate model information corresponding to said symbol, said model information and said symbol emerge from said array at approximately the same time.

7. The linear systolic array of claim 6 wherein:

each said data processing element executes Context Algorithm to generate said set of context-relevant data for said data string.

8. A linear systolic array for processing a data string comprised of a plurality of symbols in a plurality of clock cycles comprising:

a plurality of data processing elements (DPEs) connected in a linear array;

each said DPE including a data processing means, a symbol register, a local memory and a pipeline memory;

each said symbol register receiving a said symbol of said data string at each said clock cycle;

each said data processing means, individually or in conjunction with said data processing means of other said DPEs, adaptively generating a set of context-relevant data relating to each said symbol at each said clock cycle; each said set stored in said respective local memory and said respective pipeline memory;

each said DPE, during each said clock cycle, transmitting said symbol and at least a portion of said set of context-relevant data from said symbol register and said pipeline memory, respectively, to the corresponding symbol register and pipeline memory of the next DPE of said array, whereby a coding or prediction function with respect to said symbol is performed.

9. A linear systolic array of claim 8 further including a first DPE and a last DPE, wherein:

each said symbol register is connected to said symbol register of the next DPE downstream from said first DPE;

each said pipeline memory is connected to said pipeline memory of the next DPE downstream from said first DPE;

said symbol register of said first DPE receives one said symbol of said data string at each said clock cycle; said symbol register of each said DPE other than said first DPE receives one said symbol from said symbol register of the adjacent DPE upstream from said DPE at each said clock cycle;

at least a portion of said set of context-relevant data is transmitted from said respective pipeline memory of each said DPE other than said last DPE to the corresponding pipeline memory of the next DPE downstream at each clock cycle; and said coding or prediction function is performed in accordance with at least a portion of said set of context-relevant data in said pipeline memory of said last DPE.

10. A linear systolic array of claim 9 wherein:

each DPE further includes a temporary-storage register;

each said local memory further has a context register, a plurality of symbol-probability counters, a relative-efficiency register, and a node-status flag;

each said pipeline memory further has a new-node flag, a node-length register, a coding-efficiency register, and a best-probability buffer;

each said new-node flag is connected to said new-node flag of the next DPE of said array;

each said node-length register is connected to said node-length register of the next DPE of said array;

each said coding-efficiency register is connected to said coding-efficiency register of the next DPE of said array; and each said best-probability buffer is connected to said best-probability buffer of the next DPE of said array.

11. A method of processing a data string comprised of a plurality of symbols in a plurality of clock cycles in a linear systolic array comprised of a plurality of data processing elements (DPEs), comprising the steps of:

(a) receiving one of said symbols of said data string at each clock cycle and transmitting said received symbol along said array at a rate of one DPE at a time;

(b) each said DPE adaptively generating a set of context-relevant data relating to the received symbol at each clock cycle; and (c) said DPEs utilizing, individually or in conjunction with one another, at least one said set of context-relevant data to generate model information corresponding to the received symbol.

12. A method of processing a data string in accordance with claim 11 wherein said set of context-relevant data is generated by Context Algorithm.

13. A method of processing a data string comprised of a plurality of symbols in a plurality of clock cycles in a linear systolic array comprised of a plurality of data processing elements (DPEs), said array including a first DPE, comprising the steps of:

(a) initializing said DPEs by assigning an empty context to said first DPE and an undefined context to each said DPE other than said first DPE;

(b) said first DPE receiving one of said symbols at each clock cycle; each said DPE transmitting each said symbol downstream along said array in a time-progressive manner;

(c) performing in a time-progressive manner a plurality of operations in accordance with Context Algorithm, including associating each said DPE with a defined context; adaptively updating symbol statistics at each said DPE; and computing the optimal model for each said symbol based on said symbol statistics; and (d) utilizing said optimal model to perform a coding or prediction function with respect to each said symbol.

14. A method of processing a a data string comprised of a plurality of symbols of an alphabet in a plurality of clock cycles in a linear systolic array including a plurality of data processing elements (DPEs), said array having a first DPE, each said DPE including a symbol register, a temporary-storage register, a local memory, and a pipeline memory, said local memory having a context register, a plurality of symbol-probability registers, a relative-efficiency register, and a node-status flag, said pipeline memory having a new-node flag, a node-length register, a coding-efficiency register, and a best-model buffer, comprising the steps of:

(a) assigning an empty context to said first DPE context register of said first DPE, setting said symbol-probability counters and node-status flag of said first DPE to 0; assigning a negative value to said relative-efficiency register of said first DPE; assigning an undefined context to said context register of each said DPE other than said first DPE; assigning a positive value to said relative-efficiency register of each said DPE other than said first DPE; assigning 0 to said new-node flag, said node-length register, said coding-efficiency register and said best-probability buffer of each said DPE; and assigning to said temporary-storage register a plurality of symbols of said data string preceding said symbol currently occupying said symbol register;

(b) at said first DPE, assigning an estimator expressed over e bits to said best-probability buffer;

assigning the value of the logarithm of said estimator, multiplied by $-1$ and expressed over d bits, to said coding-efficiency register; incrementing said symbol counter corresponding to said symbol of said data string by one; and setting said new-node flag to 0 if said node-status flag has a value of 1, or else setting both said node-status flag and said new-node flag to 1 and said context-length register to 0 if said node-status flag has a value of 0;

(c) at any said DPE other than said first DPE, said context register of said DPE containing a defined context having a length of $|s|$ bits, comparing the first $|s|$ bits of said context register and said temporary-storage register;

if said two sets of $|s|$ bits are not identical, shifting the contents of said temporary-storage register to the right by one bit and filling the leftmost cell of said temporary-storage register with said symbol currently occupying said symbol register;

and transmitting the contents of said symbol register, said new-node register, said node-length register, said coding-efficiency register and said best-probability buffer of said DPE to the corresponding symbol register, new-node register, node-length register, coding-efficiency register and best-probability buffer of the DPE to the right, the contents of said node-length register denoted by NLR;

if said two sets of $|s|$ bits are identical, and if said relative-efficiency register contains a negative value, replacing the contents of said best-probability buffer by an estimator expressed over e bits; and if said node-status register has a value of 0, setting said node-status register and said new-node register to 1 and setting the value of said context-length register to $|s|$;

adding the value of said coding-efficiency register to the value of said relative-efficiency register, and subtracting a d-bit representation of the logarithm of said estimator multiplied by $-1$;

writing said d-bit representation of the logarithm of said estimator multiplied by $-1$ into said coding-efficiency register;

incrementing said symbol counter corresponding to said symbol of said data string by one;

shifting the contents of said temporary-storage register to the right by one bit and filling the leftmost cell of said temporary-storage register with said symbol currently occupying said symbol register; and transmitting the contents of said symbol register, said new-node register, said node-length register, said coding-efficiency register and said best-probability buffer of said DPE to the corresponding symbol register, new-node register, node-length register, coding-efficiency register and best-probability buffer of the DPE to the right;

(d) at any said DPE other than said first DPE, said context register of said DPE containing an undefined context, if said new-node flag contains a value of 0, shifting the contents of said temporary-storage register to the right by one bit and filling the leftmost cell of said temporary-storage register with said symbol currently occupying said symbol register; and transmitting the contents of said symbol register, said new-node register, said node-length register, said coding-efficiency register and said best-probability buffer of said DPE to the corresponding symbol register, new-node register, node-length register, coding-efficiency register and best-probability buffer of the DPE to the right;

if said new-node flag contains a value of 1, copying NLR-bits from said temporary-storage register to said context register, and if said DPE is an even-numbered DPE, concatenating 0 to the right of said NLR-bits in said context register;

if said DPE is an odd-numbered DPE, concatenating 1 to the right of said NLR-bits in said context register; and assigning 1 to said symbol counter corresponding to said symbol of said data string and assigning 0 to said symbol counter corresponding to symbols of said alphabet other than said symbol of said data string;

assigning a positive value to said relative-efficiency register;

assigning 0 to said node-status flag for an even-numbered DPE and assigning 0 to both said node-status flag and said new-node flag for an odd-numbered DPE;

shifting the contents of said temporary-storage register to the right by one bit and filling the leftmost cell of said temporary-storage register with said symbol currently occupying said symbol register; and transmitting the contents of said symbol register, said new-node register, said node-length register, said coding-efficiency register and said best-probability buffer of said DPE to the corresponding symbol register, new-node register, node-length register, coding-efficiency register and best-probability buffer of the DPE to the right.

* * * * *